United States Patent
Saitou

(10) Patent No.: US 7,304,858 B2
(45) Date of Patent: Dec. 4, 2007

(54) PRINTED CIRCUIT BOARD UNIT AND ELECTRONIC APPARATUS

(75) Inventor: Akiyoshi Saitou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 257 days.

(21) Appl. No.: 11/023,489

(22) Filed: Dec. 29, 2004

(65) Prior Publication Data

US 2006/0057889 A1    Mar. 16, 2006

(30) Foreign Application Priority Data

Sep. 14, 2004  (JP) ............................. 2004-266548

(51) Int. Cl.
   *H05K 7/02*    (2006.01)
   *H05K 7/06*    (2006.01)
   *H05K 7/08*    (2006.01)
   *H05K 7/10*    (2006.01)

(52) U.S. Cl. ..................... 361/760; 361/761; 361/816

(58) Field of Classification Search ........ 361/736–737, 361/752–753, 760–763, 816–818; 333/12
   See application file for complete search history.

(56) References Cited

U.S. PATENT DOCUMENTS 5,124,888 A * 6/1992 Suzuki et al. ............... 361/740
6,188,297 B1 * 2/2001 Akiba ......................... 333/12

FOREIGN PATENT DOCUMENTS

| JP | 5-115627 | 7/1984 |
| JP | 5-114439 | 5/1993 |
| JP | 9-27692 | 1/1997 |

\* cited by examiner

*Primary Examiner*—Tuan T. Dinh
(74) *Attorney, Agent, or Firm*—Staas & Halsey LLP

(57) ABSTRACT

A printed circuit board has separate first, second and third sections arranged in a predetermined direction. A connector is mounted at the first section. A noise cut filter is mounted at the second section and connected to the connector. An electronic circuit component is mounted at the third section and connected to the noise cut filter. An electrically conductive power source layer is formed within the printed circuit board at a position outside a peripheral section adjacent the second section. The noise cut filter is allowed to operate without receiving any influence of noise from the power source layer. Noise is sufficiently removed at the noise cut filter. Noise is suppressed to the utmost in electric signals in the connector. Radiation of noise is reliably reduced at the connector. Electromagnetic interference can be suppressed.

17 Claims, 5 Drawing Sheets

PRINTED CIRCUIT BOARD UNIT AND ELECTRONIC APPARATUS

BACKGROUND OF THE INVENTION

1. Field of the Invention

The present invention relates to an electronic apparatus. In particular, the invention relates to a printed circuit board unit including a printed circuit board and an electronic circuit component mounted on the surface of the printed circuit board.

2. Description of the Prior Art

For example, a printed circuit board unit often includes a power source layer and a ground layer formed within a printed circuit board, as disclosed in Japanese Patent Application Publication No. 9-27692. A connector is mounted on the surface of the printed circuit board at a first section. An IC (Integrated Circuit) chip is likewise mounted at a second section. Signal line patterns are utilized to connect the connector to the IC chip. The power source and ground layers are formed at locations off the first section in the printed circuit board unit. The signal line patterns can thus be protected from noise transmitted from the power source and ground layers to the utmost.

A noise cut filter such as a transformer is mounted on the surface of the printed circuit board in the aforementioned printed circuit board unit between the connector and the IC chip. The transformer is located on a third section defined between the first and second sections. The power source and ground layers are formed in the third section. If the transformer is exposed within a larger noise transferred from the power source and ground layers, the transformer cannot sufficiently remove the noise. The noise tends to reach the connector through the signal line pattern. A so-called electromagnetic interference, EMI, must occur between the connector and any outside equipment.

SUMMARY OF THE INVENTION

It is accordingly an object of the present invention to provide a printed circuit board unit capable of suppressing noise than ever. It is an object of the present invention to provide an electronic apparatus enjoying the advantage of the mentioned printed circuit board unit.

According to the present invention, there is provided a printed circuit board unit comprising: a printed circuit board having separate first, second and third sections arranged in a predetermined direction; a connector mounted on the surface of the printed circuit board at the first section; a noise cut filter mounted on the surface of the printed circuit board at the second section and connected to the connector; an electronic circuit component mounted on the surface of the printed circuit board at the third section and connected to the noise cut filter; and an electrically conductive power source layer formed within the printed circuit board at a position outside a peripheral section adjacent the second section.

The printed circuit board unit enables disposition of the power source layer in the printed circuit board at a position outside the peripheral section. The noise cut filter is located on the surface of the printed circuit board at the second section inside the peripheral section, so that the noise cut filter is allowed to operate without receiving any influence of noise from the power source layer. Noise is sufficiently removed at the noise cut filter. Noise is suppressed to the utmost in electric signals in the connector. Radiation of noise is reliably reduced at the connector. Electromagnetic interference can be suppressed.

The power source layer may be located off the first and second sections. The connector is located at the first section. Accordingly, the connector is allowed to operate without receiving any influence of noise from the power source layer. Noise is sufficiently removed at the connector in the same manner as mentioned above. Radiation of noise is reliably reduced at the connector. Electromagnetic interference can be suppressed.

The printed circuit board unit may further comprise an electrically conductive ground layer crossing between the second and third sections within the peripheral section. The ground layer is thus allowed to serve as a shield. The electrically conductive ground layer may be formed within the printed circuit board at least off the first and second sections. The noise cut filter and the connector are thus allowed to operate without receiving any influence of noise from the power source layer. Noise is sufficiently removed at the noise cut filter. Noise is suppressed to the utmost in electric signals in the connector. Radiation of noise is reliably reduced at the connector. Electromagnetic interference can be suppressed.

The printed circuit board unit may further comprise a coupling member contacting with the ground layer. In this case, the coupling member may protrude from the printed circuit board. The coupling member may be screwed into a frame member, for example. If the frame member is made of an metallic material, electric current is allowed to flow in the frame member through the coupling member from the ground layer. The characteristic impedance of the ground layer can sufficiently be reduced.

The printed circuit board unit may further comprise a radio wave absorber layer crossing between the second and third sections within the peripheral section. The radio wave absorber layer is located adjacent the noise cut filter. The radio wave absorber layer is allowed to absorb radio waves generated at the aforementioned power source layer as well as the aforementioned ground layer. The noise cut filter and the connector are thus allowed to operate without receiving any influence of radio waves from the power source and ground layers. Noise can sufficiently be suppressed in electric signals in the connector. Electromagnetic interference can be suppressed.

The printed circuit board unit may further comprise an electrically conductive auxiliary ground layer crossing between the second and third sections within the peripheral section. A coupling member may be attached to the printed circuit board unit to contact with the auxiliary ground layer. The coupling member may protrude from the printed circuit board. Electric current may be allowed to flow through the coupling member to a frame member from the auxiliary ground layer, for example, in the same manner as described above. The characteristic impedance of the auxiliary ground layer can sufficiently be reduced. Additionally, the auxiliary ground layer crosses between the second and third sections within the peripheral section, so that the auxiliary ground layer is allowed to serve as a shield.

The printed circuit board may be utilized in an electronic apparatus. In this case, the electronic apparatus may include: an enclosure; a printed circuit board enclosed within the enclosure, said printed circuit board having separate first, second and third sections arranged in a predetermined direction; a connector mounted on the surface of the printed circuit board at the first section; a noise cut filter mounted on the surface of the printed circuit board at the second section and connected to the connector; an electronic circuit component mounted on the surface of the printed circuit board at the third section and connected to the noise cut filter; and an electrically conductive power source layer formed within the printed circuit board at a position outside a peripheral section adjacent the second section.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
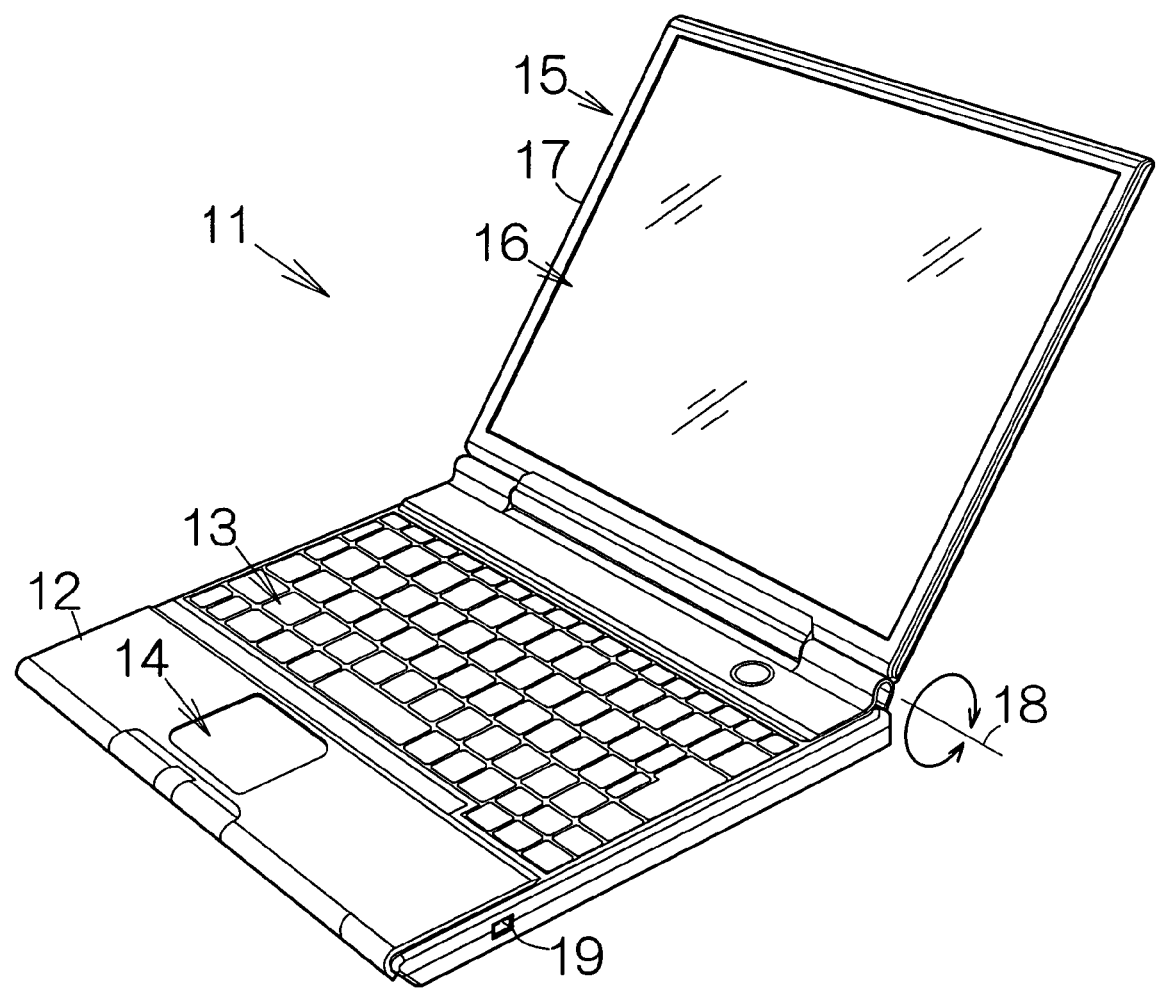
FIG. 1 is a perspective view schematically illustrating a notebook personal computer as an example of an electronic apparatus.

FIG. 1 schematically illustrates a notebook personal computer 11 as an example of an electronic apparatus according to an embodiment of the present invention. The notebook personal computer 11 includes a main enclosure 12 containing a motherboard, for example. Electronic circuit components such as a central processing unit (CPU) and a memory are mounted on the motherboard. The CPU implements various processings based on software programs and data temporarily stored in the memory, for example. The software programs and data may be stored in a mass storage device such as a hard disk drive (HDD) likewise contained within the main enclosure 12.

Input devices such as a keyboard 13 and a pointing device 14 are incorporated in the main enclosure 12. The user of the notebook personal computer 11 is allowed to input various instructions and data to the CPU through the input devices 13, 14. A touch pad may be employed as the pointing device 14, for example.

A display device 15 is coupled to the main enclosure 12. The display device 15 includes a display enclosure 17 containing a flat display panel such as a liquid crystal display (LCD) panel 16, for example. The display enclosure 17 is coupled to the main enclosure 12 for relative rotation around a rotation axis 18 set at the end of the main enclosure 12. The display enclosure 17 is thus allowed to rotate relative to the main enclosure 12. The rotary movement of the display enclosure 17 enables superposition of the display device 15 over the main enclosure 12. Various texts and graphics are displayed on the screen of the LCD panel 16 in accordance with the operation of the CPU and the manipulation of the input devices 13, 14.

A connector 19 of a predetermined interface standard is fixed to the main enclosure 12, for example. Here, a connector for a local area network (LAN) interface, such as RJ-45 type, is for example utilized as the connector. A LAN cable, not shown, can be connected to the connector 19. The notebook personal computer 11 is connected to a LAN through the connector 19.

Figure 2:
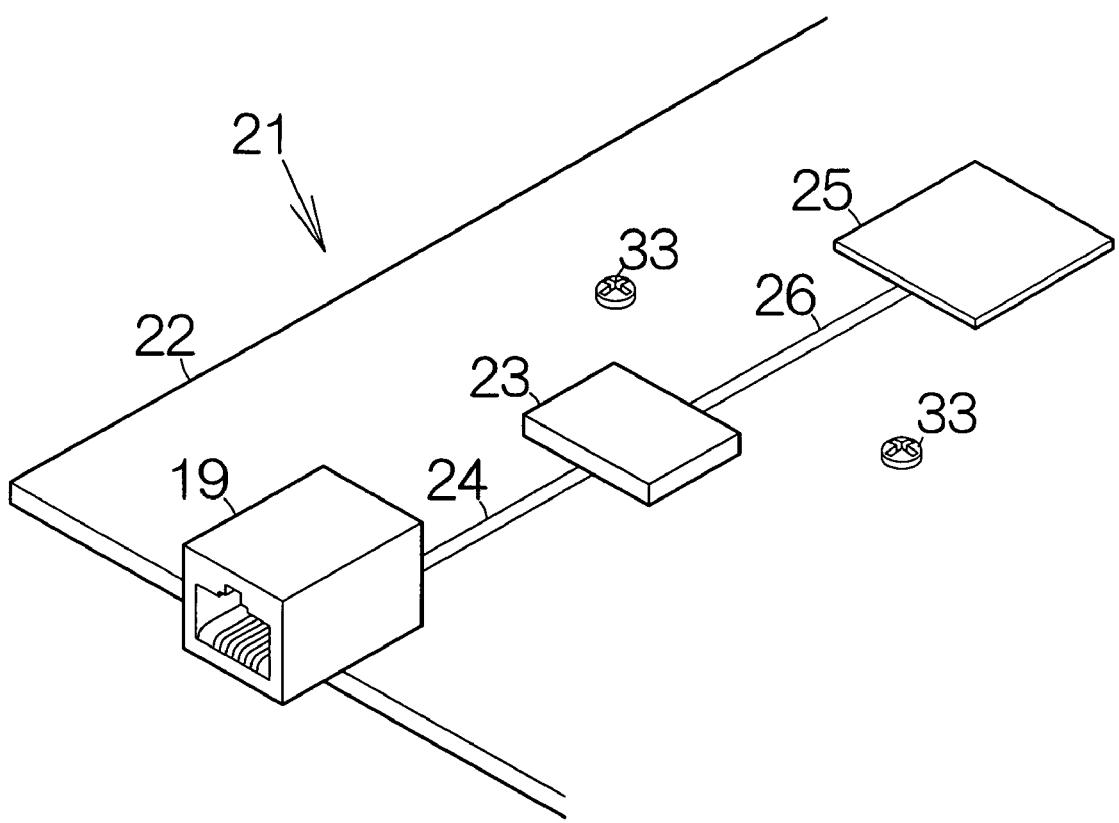
FIG. 2 is a partial perspective view illustrating a printed circuit board unit according to a first embodiment of the present invention.

FIG. 2 illustrates a specific example of the motherboard 21 as a printed circuit board unit according to a first embodiment of the present invention. The motherboard 21 is contained within the main enclosure 12 as described above. The motherboard 21 includes a printed circuit board 22. The aforementioned connector 19 is mounted on the front surface of the printed circuit board 22. A noise cut filter, namely a transformer 23, is also mounted on the front surface of the printed circuit board 22. The transformer 23 is connected to the connector 19. A signal line pattern 24 made of an electrically conductive material is utilized to establish electric connection between the connector 19 and the transformer 23. The signal line pattern 24 may extend over the front and back surfaces of the printed circuit board 22.

A LAN controller 25 as an electronic circuit component is connected to the transformer 23. The LAN controller 25 is mounted on the front surface of the printed circuit board 22. A signal line pattern 26 made of an electrically conductive material is utilized to establish electric connection between the transformer 23 and the LAN controller 25. The signal line pattern 26 may extend over the front and back surfaces of the printed circuit board 22. The LAN controller 25 operates to establish a data communication with other computer. Electric signals are transferred through the signal line patterns 24, 26 in the data communication.

Figure 3:
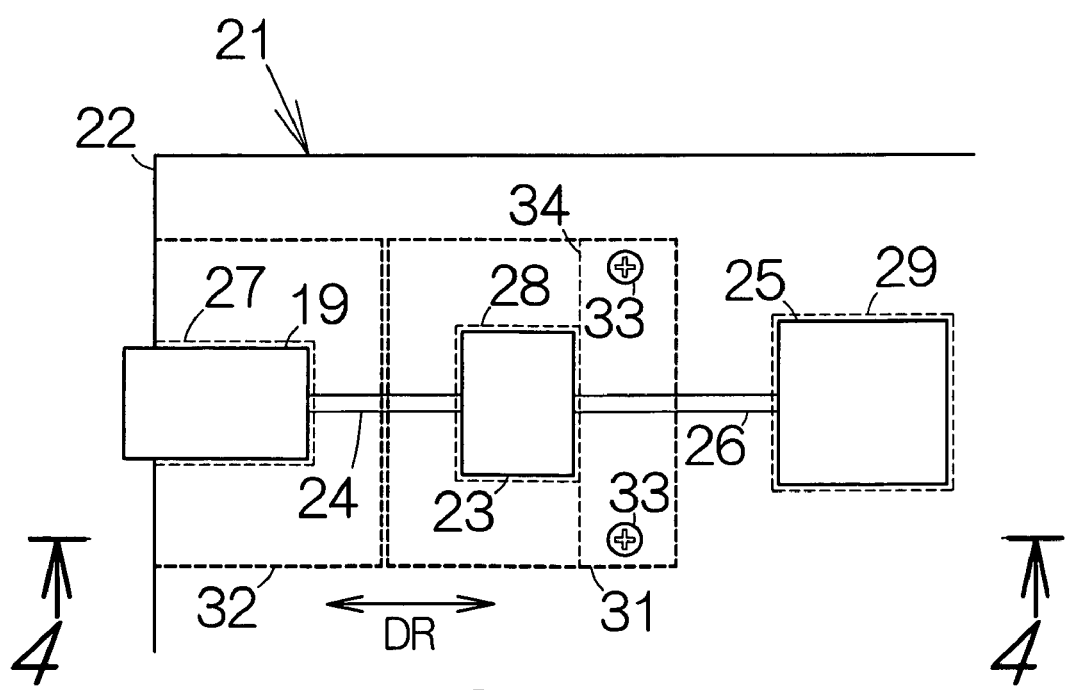
FIG. 3 is a partial plan view illustrating the front surface of the printed circuit board unit.

As shown in FIG. 3, first, second and third sections 27, 28, 29 are separately defined in the printed circuit board 22. The first, second and third sections 27, 28, 29 are in this sequence spaced from one another in a predetermined direction DR. The first section 27 is defined along the outer periphery of the printed circuit board 22. The connector 19 is located at the first section 27. The transformer 23 is located at the second section 28. The LAN controller 25 is located at the third section 29. First and second peripheral sections 31, 32 are also defined in the printed circuit board 22. The first peripheral section 31 is designed to surround the second section 28. The second peripheral section 32 is designed to surround the first section 27. The inner end of the second peripheral section 32 is in contact with the outer end of the first peripheral section 31. The outer end of the second peripheral section 32 is aligned with the outer periphery of the printed circuit board 22.

A pair of coupling member such as screw 33, 33 is attached to the printed circuit board 22, for example. The screws 33 are located in a fourth section 34 crossing between the second and third sections 28, 29 within the first peripheral section 31. The screws 33 completely penetrate through the printed circuit board 22. The screws 33 thus protrude from the back surface of the printed circuit board 22.

Figure 4:
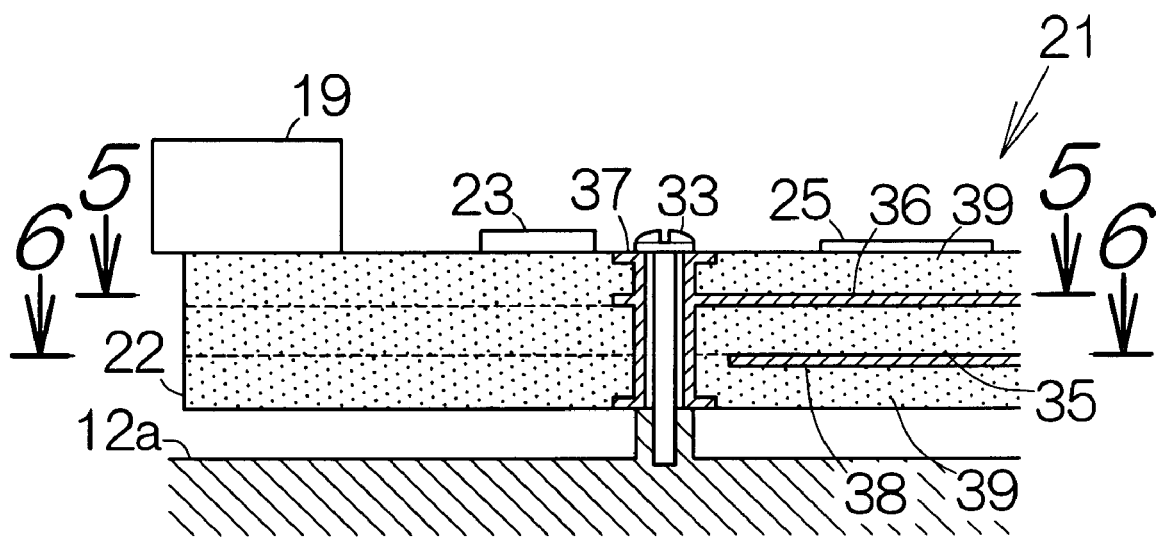
FIG. 4 is a vertical sectional view taken along the line 4-4 in FIG. 3.

As shown in FIG. 4, the printed circuit board 22 includes an insulating layer or core substrate 35. The core substrate 35 has a rigidity enough to keep its shape. An electric conductive ground layer 36 extends over the front surface of the core substrate 35. The ground layer 36 is connected to a via 37. The via 37 is designed to penetrate through the printed circuit board 22. The ground layer 36 and the via 37 may be made of an electrically conductive material such as copper, for example. The aforementioned screw 33 is received in an inner space of the via 37. The head of the screw 33 is designed to contact with the via 37. The tip end of the screw 33 is coupled to a boss standing from a frame member 12a incorporated in the main enclosure 12. The frame member 12a is made of a metallic material, for example. The screws 33 are in this manner electrically connected to the main enclosure 12.

An electrically conductive power source layer 38 extends over the back surface of the core substrate 35. The power source layer 38 is spaced from the ground layer 36 and the via 37. The power source layer 38 may be made of an electrically conductive material such as copper. The LAN controller 25 receives the operating current from the power source layer 38. The operating current is allowed to flow into the ground layer 36 through the LAN controller 25. A current path of the operating current is in this manner established.

Insulator layers 39, 39 are overlaid on the front and back surfaces of the core substrate 35, respectively. The insulator layer 39 covers over the ground layer 36 on the front surface of the core substrate 35. The insulator layer 39 covers over the power source layer 38 on the back surface of the core substrate 35. The aforementioned signal line patterns 24, 26 are formed on the exposed surfaces of the insulator layers 39, 39, respectively. The via 37 penetrates through the core substrate 35 and the insulator layers 39, 39.

Figure 5:
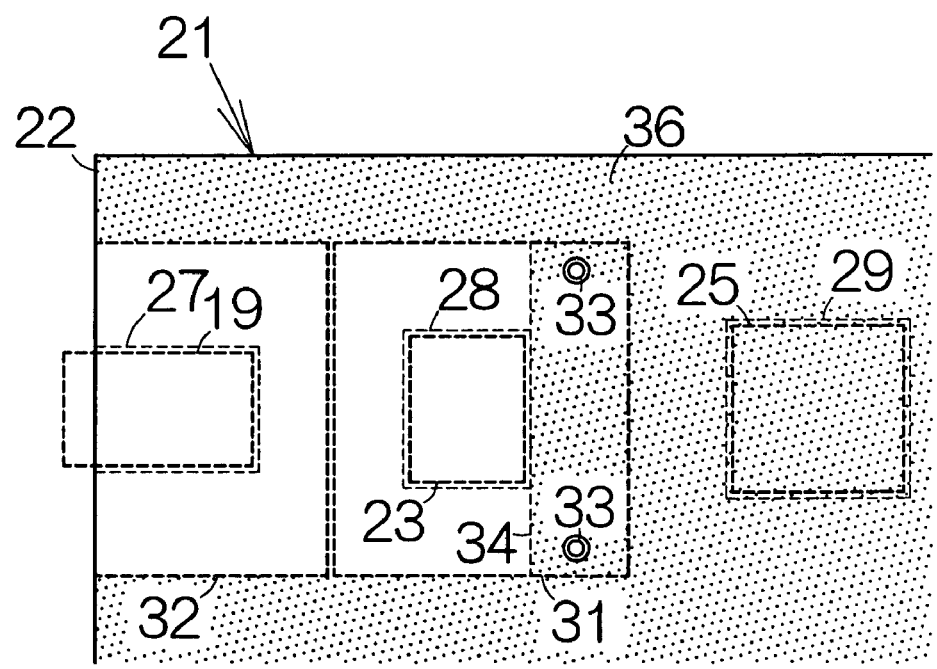
FIG. 5 is a horizontal sectional view taken along the line 5-5 in FIG. 4, for illustrating the location of a ground layer.
Figure 6:
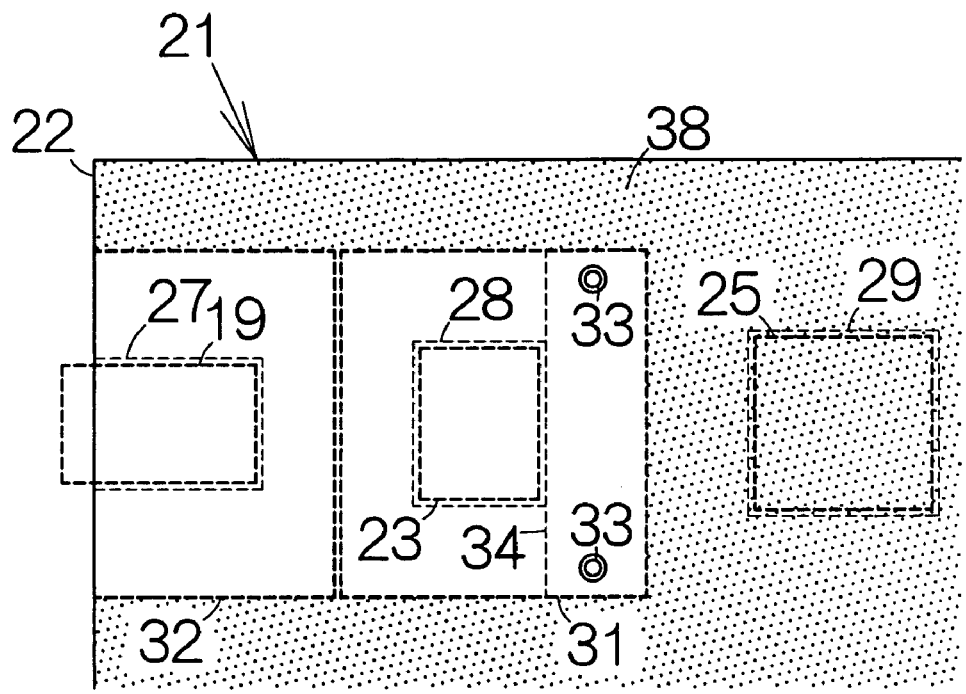
FIG. 6 is a horizontal sectional view taken along the line 6-6 in FIG. 4, for illustrating the location of a power source layer.

As shown in FIG. 5, the ground layer 36 is formed in the fourth section 34 within the first peripheral section 31. In addition, the ground layer 36 is located at a position off the second peripheral section 32, Here, the ground layer 36 is located at a position at least off the first and second sections 27, 28. On the other hand, the power source layer 38 is formed at a position off the first and second peripheral sections 31, 32, as shown in FIG. 6. Specifically, the power source layer 38 is located at a position off the first and second sections 27, 28.

The motherboard 21 enables disposition of the power source layer 38 in the printed circuit board 22 at a position outside the first and second peripheral sections 31, 32. The transformer 32 and the connector 19 are thus allowed to operate without receiving any influence of noise from the power source layer 38. Noise is sufficiently removed at the transformer 23. Noise is suppressed to the utmost in electric signals in the signal line pattern 24 and the connector 19. Radiation of noise is reliably reduced at the LAN cable. Electromagnetic interference can be suppressed.

Moreover, the screws 33 protrude from the printed circuit board 22. The screws 33 are allowed to contact with the ground layer 36. The screws 33 are finally coupled to the frame member 12a. The operating current is allowed to flow into the frame member 12a through the screws 33 from the ground layer 36. The characteristic impedance is sufficiently reduced in the ground layer 36. Additionally, the ground layer 36 crosses between the second and third sections 28, 29 within the first peripheral section 31, so that the ground layer 36 serves as a shielding layer.

Figure 7:
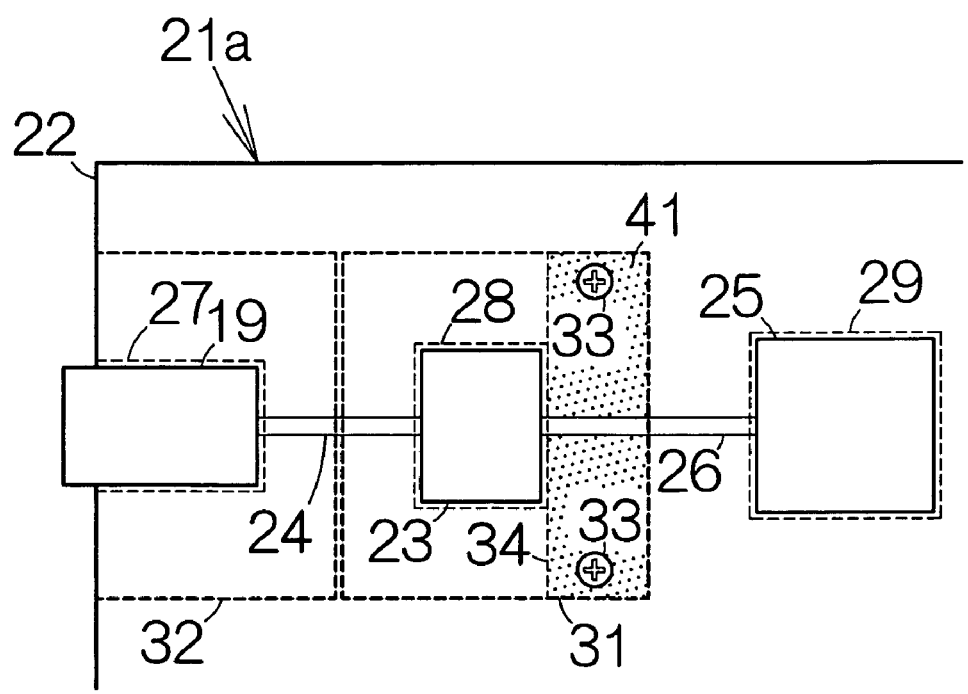
FIG. 7 is a partial plan view, corresponding to FIG. 3, illustrating the front surface of a printed circuit board unit according to a second embodiment of the present invention.

FIG. 7 schematically illustrates the structure of a motherboard 21a according to a second embodiment of the present invention. The motherboard 21a further includes an auxiliary ground layer 41 over the front surface of the printed circuit board 22. The auxiliary ground layer 41 is formed at the fourth section 34 within the first peripheral section 31. The auxiliary ground layer 41 is connected to the ground layer 36 within the printed circuit board 22 through the via 37. The heads of the screws 33 are allowed to contact with the via 37 namely the auxiliary ground layer 41. The screws 33 are thus connected to the ground layer 36. Like reference numerals are attached to components or structure equivalent to those of the first embodiment.

The motherboard 21a enables disposition of the power source layer 38 in the printed circuit board 22 at a position off the first peripheral section 31. The transformer 32 is thus allowed to operate without receiving any influence of noise from the power source layer 38. Noise is sufficiently removed at the transformer 23. Noise is suppressed to the utmost in electric signals in the signal line pattern 24. Electromagnetic interference can be suppressed.

Moreover, the screws 33 contact with the ground layer 36 and the auxiliary ground layer 41. The operating current is allowed to flow into the frame member 12a through the screws 33 from the ground layer 36 and the auxiliary ground layer 41. The characteristic impedance is sufficiently reduced in the ground layer 36 and the auxiliary ground layer 41. Additionally, the auxiliary ground layer 41 crosses between the second and third sections 28, 29 within the first peripheral section 31, so that the ground layer 41 serves as a shielding layer.

Figure 8:
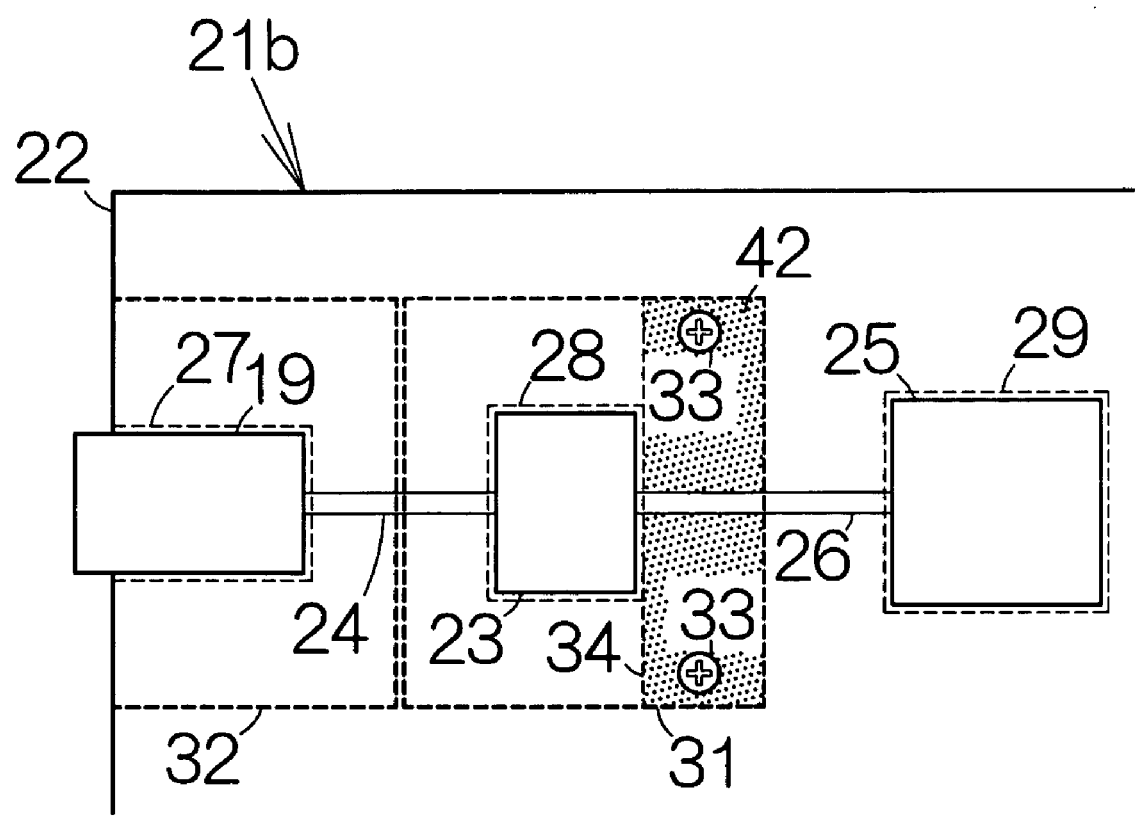
FIG. 8 is a partial plan view, corresponding to FIG. 3, illustrating the front surface of a printed circuit board unit according to a third embodiment of the present invention.

FIG. 8 schematically illustrates the structure of a motherboard 21b according to a third embodiment of the present invention. The motherboard 21b allows formation of a radio wave absorber layer 42 over the front surface of the printed circuit board 22 in place of the aforementioned auxiliary ground layer 41. The radio wave absorber layer 42 is formed at the fourth section 34 within the first peripheral section 31. The radio wave absorber layer 42 may be made of a conventional radio wave material, for example. Like reference numerals are attached to components or structure equivalent to those of the first and second embodiments.

The motherboard 21b enables disposition of the power source layer 38 in the printed circuit board 22 at a position off the first peripheral section 31. The transformer 32 is thus allowed to operate without receiving any influence of noise from the power source layer 38. Noise is sufficiently removed at the transformer 23. Noise is suppressed to the utmost in electric signals in the signal line pattern 24. Electromagnetic interference can be suppressed. The screws 33 are allowed to contact with the ground layer 36. The characteristic impedance is sufficiently reduced in the ground layer 36.

In addition, the radio wave absorber layer 42 is formed on the front surface of the printed circuit board 22. The radio wave absorber layer 42 crosses between the second and third sections 28, 29. The radio wave absorber layer 42 is located adjacent the transformer 23. The radio wave absorber layer 42 serves to absorb radio waves transmitted from the power source and ground layers 38, 36. The transformer 23 is thus allowed to operate without receiving any influence of radio waves from the power source and ground layers 38, 36. Noise is suppressed to the utmost in electric signals in the signal line pattern 24. Electromagnetic interference can be suppressed.

It should be noted that any connector, such as a USB (universal serial bus) connector or the like, may be employed as the connector 19, in place of the aforementioned LAN connector.

What is claimed is:

1. A printed circuit board unit comprising:
    a printed circuit board having separate first, second and third sections arranged in a predetermined direction along a surface of the printed circuit board;
    a connector mounted on the surface of the printed circuit board at the first section;
    a noise cut filter mounted on the surface of the printed circuit board at the second section and electrically connected to the connector through a first signal line pattern formed on the surface of the printed circuit board;

an electronic circuit component mounted on the surface of the printed circuit board at the third section and electrically connected to the noise cut filter through a second signal line pattern formed on the surface of the printed circuit board; and an electrically conductive power source layer extending in parallel with the surface of the printed circuit board and designed to supply the electronic circuit component with electric power, the power source layer being formed within the printed circuit board at a position outside a peripheral section surrounding the second section.

2. The printed circuit board unit according to claim 1, further comprising an electrically conductive ground layer crossing between the second and third sections within the peripheral section.

3. The printed circuit board unit according to claim 1, further comprising a radio wave absorber layer crossing between the second and third sections within the peripheral section.

4. The printed circuit board unit according to claim 1, further comprising an electrically conductive ground layer formed within the printed circuit board at least off the first and second sections.

5. The printed circuit board unit according to claim 1, wherein the power source layer is located off the first and second sections.

6. The printed circuit board unit according to claim 1, wherein the power source layer extends across the third section.

7. The printed circuit board unit according to claim 2, further comprising a coupling member contacting with the ground layer, said coupling member protruding from the printed circuit board.

8. An electronic apparatus comprising:

an enclosure;

a printed circuit board enclosed within the enclosure, said printed circuit board having separate first, second and third sections arranged in a predetermined direction along a surface of the printed circuit board;

a connector mounted on the surface of the printed circuit board at the first section;

a noise cut filter mounted on the surface of the printed circuit board at the second section and electrically connected to the connector through a first signal line pattern formed on the surface of the printed circuit board;

an electronic circuit component mounted on the surface of the printed circuit board at the third section and electrically connected to the noise cut filter through a second signal line pattern formed on the surface of the printed circuit board; and an electrically conductive power source layer extending in parallel with the surface of the printed circuit board and designed to supply the electronic circuit component with electrical power, the power source layer being formed within the printed circuit board at a position outside a peripheral section surrounding the second section.

9. The electronic apparatus according to claim 8, further comprising an electrically conductive ground layer crossing between the second and third sections within the peripheral section.

10. The electronic apparatus according to claim 8, further comprising a radio wave absorber layer crossing between the second and third sections within the peripheral section.

11. The electronic apparatus according to claim 8, further comprising an electrically conductive ground layer formed within the printed circuit board at least off the first and second sections.

12. The electronic apparatus according to claim 8, wherein the power source layer is located off the first and second sections.

13. The electronic apparatus according to claim 8, wherein the power source layer extends across the third section.

14. The electronic apparatus according to claim 9, further comprising a coupling member contacting with the ground layer, said coupling member protruding from the printed circuit board.

15. The electronic apparatus according to claim 11, further comprising a coupling member contacting with the ground layer, said coupling member protruding from the printed circuit board.

16. The electronic apparatus according to claim 11, further comprising a radio wave absorber layer crossing between the second and third sections within the peripheral section.

17. The electronic apparatus according to claim 14, wherein the coupling member electrically connects the ground layer with a metallic frame member incorporated in the enclosure.

* * * * *

UNITED STATES PATENT AND TRADEMARK OFFICE
CERTIFICATE OF CORRECTION

| | |
|---|---|
| PATENT NO. | : 7,304,858 B2 |
| APPLICATION NO. | : 11/023489 |
| DATED | : December 4, 2007 |
| INVENTOR(S) | : Akiyoshi Saitou |

It is certified that error appears in the above-identified patent and that said Letters Patent is hereby corrected as shown below:

On the Title Page, Item -56- (Foreign Patent Documents), Line 1, change "5-115627" to --59-115627--.

Signed and Sealed this

Third Day of June, 2008

JON W. DUDAS
*Director of the United States Patent and Trademark Office*